United States Patent
Roh

[11] Patent Number: 6,101,137
[45] Date of Patent: Aug. 8, 2000

[54] SEMICONDUCTOR MEMORY DEVICE HAVING DELAY LOCKED LOOP (DLL)

[75] Inventor: Jae-gu Roh, Suwon, Rep. of Korea

[73] Assignee: Samsung Electronics Co., Ltd., Kyungki-do, Rep. of Korea

[21] Appl. No.: 09/338,545

[22] Filed: Jun. 23, 1999

[30] Foreign Application Priority Data

Jun. 23, 1998 [KR] Rep. of Korea ............... 98-23686

[51] Int. Cl.[7] .................. G11C 7/00; H03L 7/00
[52] U.S. Cl. .............. 365/194; 365/233; 327/156; 327/158; 327/162
[58] Field of Search ................ 365/233, 189.08, 365/194; 327/156, 158, 162, 159

[56] References Cited

U.S. PATENT DOCUMENTS

| | | | |
|---|---|---|---|
| 5,059,838 | 10/1991 | Motegi et al. | 327/276 |
| 5,157,277 | 10/1992 | Tran et al. | 327/156 |
| 5,740,115 | 4/1998 | Ishibashi et al. | 365/203 |
| 5,754,490 | 5/1998 | Harrison et al. | 365/233 |

*Primary Examiner*—Son Mai
*Attorney, Agent, or Firm*—Kile, McIntyre, Harbin & Lee; Eugene M. Lee

[57] ABSTRACT

A semiconductor memory device having a delay locked loop includes a delay locked loop and a voltage supply unit. The delay locked loop reduces the skew between a clock and data. The voltage supply unit supplies the voltages required by the delay locked loop when the delay locked loop is operating and is deactivated when the delay locked loop is not operating.

7 Claims, 7 Drawing Sheets

SEMICONDUCTOR MEMORY DEVICE HAVING DELAY LOCKED LOOP (DLL)

BACKGROUND OF THE INVENTION

1. Field of the Invention

The present invention relates generally to a semiconductor memory device having a delay locked loop and, more particularly, to a delay locked loop voltage supply circuit.

2. Description of the Related Art

Large scale integrated circuits such as semiconductor memory devices, particularly double data rate synchronous DRAM semiconductor devices, may include a delay locked loop to reduce skew between clock signals or between a clock signal and data. However. delay locked loops are sensitive to noise introduced by the power supply. One solution to this problem is to include a direct current voltage generator as an internal power voltage generator and reference voltage generator on the semiconductor memory device, dedicated to the delay locked loop.

However, in low frequency applications, where the problem of skew between clock signals and data is reduced, it is desirable to turn the delay locked loop off. In a semiconductor device with a delay locked loop and a direct current voltage generator as described above, the direct current voltage generator continues to operate even when the delay locked loop is not in use, causing unnecessary power consumption.

SUMMARY OF THE INVENTION

To solve the above problem, the present invention provides a semiconductor memory device which reduces unnecessary power consumption caused by a direct current voltage generator.

Accordingly, there is provided a semiconductor memory device comprising a delay locked loop and a voltage supply unit for generating at least one voltage for the delay locked loop, wherein the voltage supply unit generates the at least one voltage when the delay locked loop is in use and does not generate the at least one voltage when the delay locked loop is not in use. The voltage supply unit may generate a reference voltage and an internal supply voltage for the delay locked loop, and is deactivated in response to a control signal when the delay locked loop is not in use.

In accordance with another aspect of the invention, the semiconductor memory voltage supply unit comprises a reference voltage generation unit for receiving the control signal and generating a delay locked loop reference voltage if the control signal is disabled, and an internal voltage generator for receiving the control signal and the delay locked loop reference voltage and generating an internal supply voltage if the control signal is disabled.

In accordance with another aspect of the invention, there is provided a voltage supply unit for supplying at least one voltage to a delay locked loop. The delay locked loop control circuit comprises a reference voltage generation unit for receiving a control signal and generating a delay locked loop reference voltage if the control signal is disabled, and an internal voltage generator for receiving the control signal and the delay locked loop reference voltage and generating an internal supply voltage if the control signal is disabled.

In accordance with yet another aspect of the invention there is provided a method for operating a delay locked loop comprising: providing a control signal which is disabled when the delay locked loop is in use and enabled when the delay locked loop is not in use, generating-a delay locked loop reference voltage only when the control signal is disabled, generating an internal supply voltage only when the control signal is disabled, and transmitting the delay locked loop reference voltage and the internal supply voltage to the delay locked loop only when the control signal is disabled.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Korean Application No. 98-23686, filed Jun. 23, 1998, discloses the same subject matter as the present application and is hereby incorporated by reference as if fully set forth herein.

Figure 1:
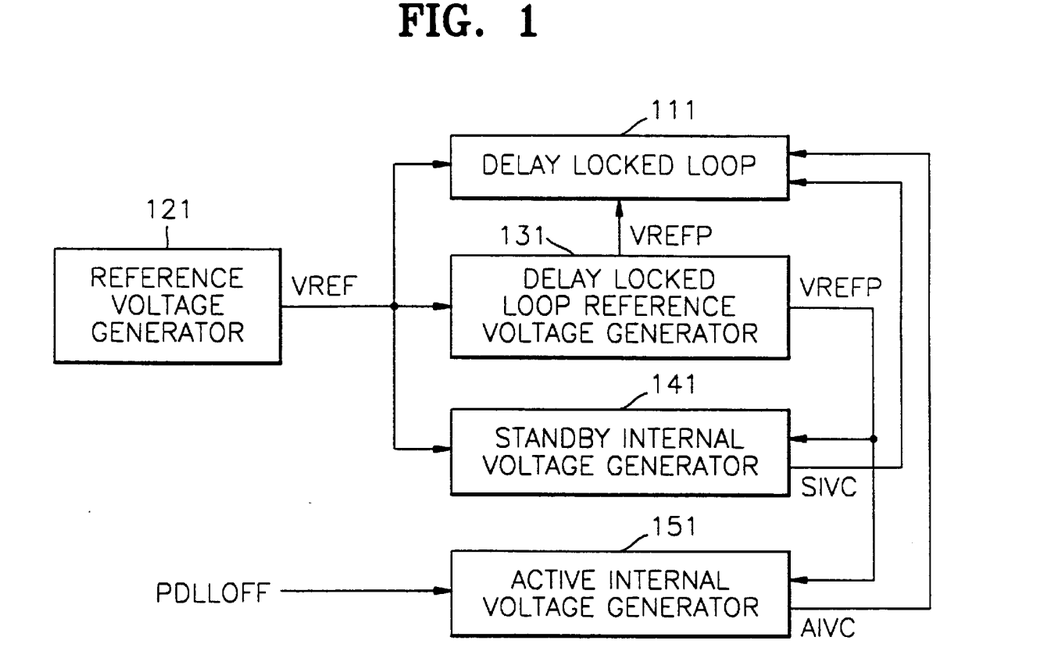
FIG. 1 is a block diagram illustrating a delay locked loop voltage supply unit in a semiconductor memory device according to a first embodiment of the present invention.
Figure 2:
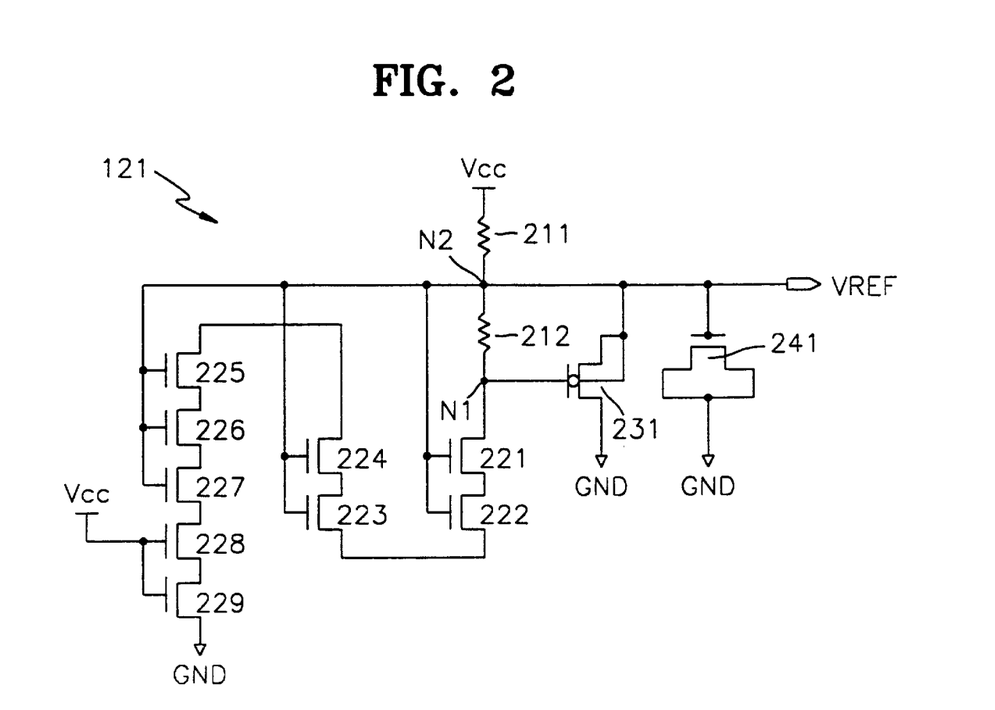
FIG. 2 is a circuit diagram illustrating the reference voltage generator shown in FIG. 1.

Referring to FIG. 1, a delay locked loop (DLL) voltage supply circuit of a semiconductor memory device according to a first embodiment of the present invention includes a delay locked loop 111 and a voltage supply unit 112. The voltage supply unit 112 includes a reference voltage generator 121, a delay locked loop reference voltage generator 131, a standby internal voltage generator 141 and an active internal voltage generator 151. The reference voltage generator 121 generates a reference voltage VREF. Referring to FIG. 2, the reference voltage generator 121 is shown comprising NMOS transistors 221 through 229, resistors 211 and 212, a PMOS transistor 231 and a capacitor 241.

The resistors 211 and 212 are connected in series, and power supply voltage VCC is applied to resistor 211.

The NMOS transistors 221 through 229 are serially connected to each other between a node N1 and a ground GND. The gates of the NMOS transistors 221 through 227 are connected to a node N2. A reference voltage VREF is generated at the node N2, and thus the NMOS transistors 221 through 227 are turned on according to the value of the reference voltage VREF. A power supply voltage VCC is applied to the gates of NMOS transistors 228 and 229, such that the NMOS transistors 228 and 229 are maintained in an "on" state. Since the NMOS transistors 221 through 229 each have internal resistance, they function as resistors when they are turned on.

The gate of the PMOS transistor 231 is connected to node Ni such that the PMOS transistor 231 is gated by the voltage at node Ni. The PMOS transistor 231 controls the reference voltage VREF. The capacitor 241 is connected between node N2 and ground GND and comprises an NMOS transistor with source and drain connected. The capacitor 241 bypasses any alternating current voltage included in the reference voltage VREF.

The reference voltage VREF is generated at node N2. The reference voltage VREF is determined by the respective internal voltage of the NMOS transistors 221 through 229 and the values of the resistors 211 and 212. When the reference voltage VREF increases, the NMOS transistors 221 through 227 are turned on more and their internal resistances, decrease. Thus, the voltage at node Ni is reduced, so that the PMOS transistor 231 is turned on more, reducing the reference voltage VREF. When reference voltage VREF is reduced, NMOS transistors 221 through 227 are turned on less, and thus PMOS transistor 231 is also turned on less, and reference voltage VREF is again increased. In this manner, the reference voltage VREF is maintained at a constant voltage level.

Figure 3:
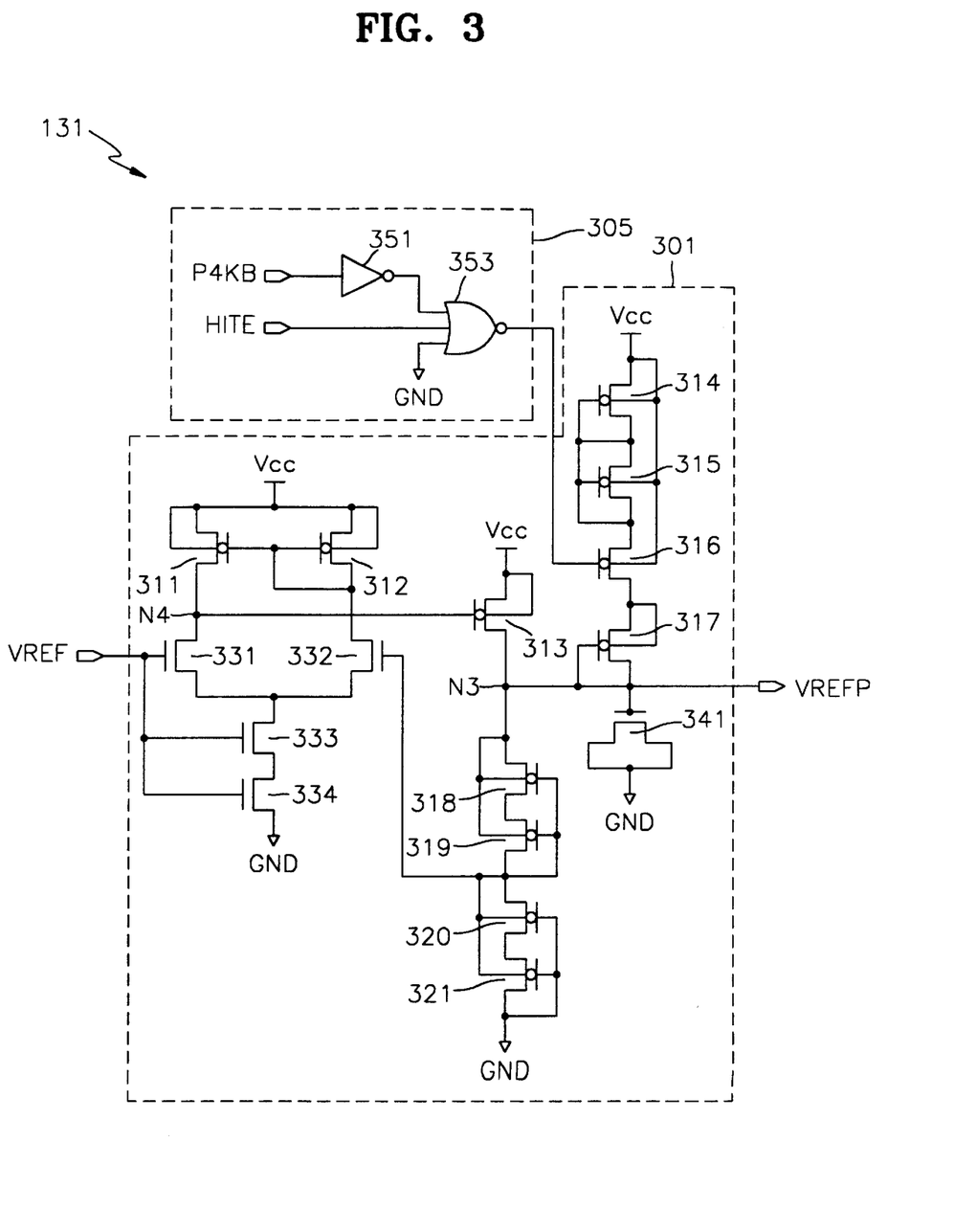
FIG. 3 is a circuit diagram illustrating the delay locked loop reference voltage generator shown in FIG. 1.

The DLL reference voltage generator 131 receives reference voltage VREF and generates a DLL reference voltage VREFP, as shown in FIG. 1. The DLL reference voltage generator 131 is shown in detail in FIG. 3. Referring to FIG. 3, the DLL reference voltage generator 131 includes a differential amplification unit 301 and a logic unit 305.

The differential amplification unit 301 comprises NMOS transistors 331 through 334, PMOS transistors 311 through 321 and a capacitor 341. The reference voltage VREF is applied to the gates of NMOS transistors 331, 333 and 334. NMOS transistors 333 and 334 act as a current source for the differential amplification unit 301. That is, when the NMOS transistors 333 and 334 are turned on, the differential amplification unit 301 is activated, and when the NMOS transistors 333 and 334 are turned off, the differential amplification unit 301 is deactivated. Thus, when reference voltage VREF is applied to the gates of NMOS transistors 333 and 334, the differential amplification unit 301 is activated. PMOS transistors 318 through 321 are connected in series between node N3 and a ground GND. The gates of PMOS transistors 320 and 321 are connected to ground GND, and thus PMOS transistors 320 and 321 are turned on all the time. The gates of PMOS transistors 318 and 319 are connected in common to the source of PMOS transistor 320, so that PMOS transistors 318 and 319 are kept in a weak turned-on state. Thus, PMOS transistors 318 through 321 function as resistors, and the voltage at the source of PMOS transistor 320 is half the voltage between node N3 and ground GND.

The capacitor 341 is connected between node N3 and ground GND, and consists of an NMOS transistor with source and drain connected. The capacitor 341 bypasses any alternating current voltage included in the DLL reference voltage VREFP.

The DLL reference voltage VREFP is generated on node N3. When reference voltage VREF is applied, NMOS transistors 331, 333 and 334 are turned on to lower the voltage of a node N4 to the level of a ground GND. Then, PMOS transistor 313 is turned on, increasing the voltage at node N3, thus generating the DLL reference voltage VREFP. The DLL reference voltage VREFP is applied across the PMOS transistors 318 through 321, and half the DLL reference voltage VREFP is applied to the gate of the NMOS transistor 332.

The voltage applied to the gate of NMOS transistor 332 is increased with an increase in the DLL reference voltage VREFP, and is decreased with a decrease in the DLL reference voltage VREFP. When the voltage applied to the gate of NMOS transistor 332 is increased with an increase in the DLL reference voltage VREFP, NMOS transistor 332 is turned on more. As a result, PMOS transistors 311 and 312 are turned on and the voltage at node N4 is increased, so that PMOS transistor 313 is turned off and the DLL reference voltage VREFP is reduced. When the DLL reference voltage VREFP is reduced, the voltage applied to the gate of NMOS transistor 332 is also reduced, so that NMOS transistor 332 is turned on less. As a result, PMOS transistors 311 and 312 are turned off and the voltage at node N4 is reduced, so that PMOS transistor 313 is turned on, increasing the DLL reference voltage VREFP. In this manner, the DLL reference voltage VREFP is maintained at a constant level.

The logic unit 305 receives signals P4KB and HITE. Logic unit 305 outputs logic high only when the signals P4KB and HITE are, respectively, logic high and logic low. Signals P4KB and HITE are used to disable the delay locked loop under certain conditions during the refresh cycle and for testing, respectively. The logic unit 305 comprises an inverter 351 for inverting the signal P4KB and a NOR gate 353 for performing a NOR operation on the output of the inverter 351 and the signal HITE.

PMOS transistors 314 through 317 are connected in series between the power supply voltage VCC and node N3, and the output of logic unit 305 is applied to the gate of PMOS transistor 316. When the output of logic unit 305 is logic high, PMOS transistor 316 is turned off, which prevents the power supply voltage VCC applied to PMOS transistor 314 from being applied to PMOS transistor 317. On the other hand, when the output of the logic unit 305 is logic low, PMOS transistor 316 is turned on and allows the power supply voltage VCC to be applied to PMOS transistor 317. Thus, the generation of DLL reference voltage VREFP is disabled when the signals P4KB and HITE are respectively logic high and logic low.

The gate of PMOS transistor 317 is connected to node N3. Accordingly, when the DLL reference voltage VREFP increases, PMOS transistor 317 is turned off, which prevents the power supply voltage VCC applied to PMOS transistor 317 from being transmitted to node N3, so that the DLL reference voltage VREFP does not increase. However, when the DLL reference voltage VREFP decreases, PMOS transistor 317 is turned on, making the power supply voltage VCC flow to node N3, so that the DLL reference voltage VREFP increases. Thus, PMOS transistor 317 provides regulation of the voltage of DLL reference voltage VREFP.

The DLL reference voltage VREFP has a different voltage level from that of the reference voltage VREF, and the DLL reference voltage VREFP is preferably twice the voltage of reference voltage VREF.

Figure 4:
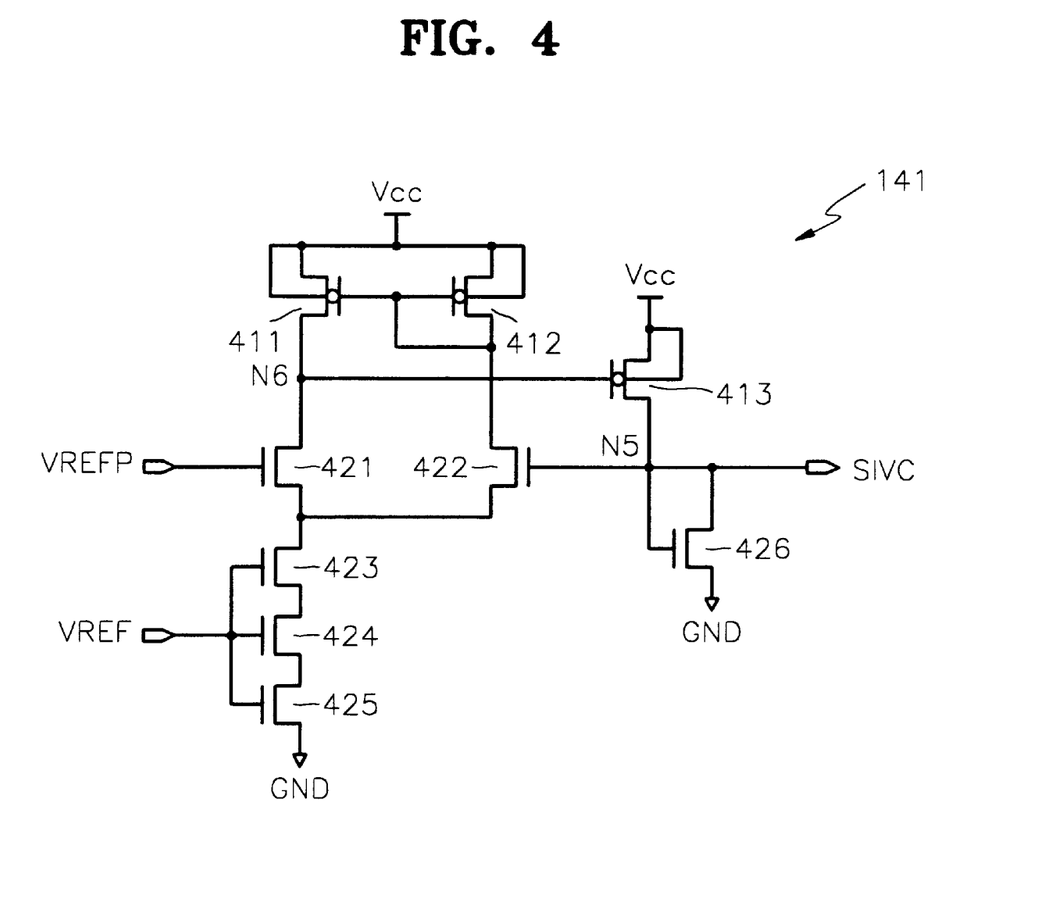
FIG. 4 is a circuit diagram illustrating the standby internal voltage generator shown in FIG. 1.

The standby internal voltage generator 141 receives the reference voltage VREF and the DLL reference voltage VREFP and generates a standby internal supply voltage SIVC, as shown in FIG. 1. The standby internal voltage generator 141 is shown in detail in FIG. 4. Referring to FIG. 4, the standby internal voltage generator 141 comprises a differential amplifier and includes PMOS transistors 411 through 413 and NMOS transistors 421 through 426. The DLL reference voltage VREFP is applied to the gate of NMOS transistor 421, and the standby internal supply voltage SIVC is generated at a node N5. The standby internal supply voltage SIVC is applied to the gate of NMOS transistor 422. NMOS transistors 423 through 425 are connected in series between the source of NMOS transistor 421 and a ground GND and act as a current source for the standby internal voltage generator 141. The DLL reference voltage VREFP is applied to the gates of NMOS transistors 423 through 425. Accordingly, when the DLL reference voltage VREFP is logic high, NMOS transistors 423 through 425 are turned on, so that the standby internal voltage generator 141 is activated. However, when DLL reference voltage VREFP is logic low, NMOS transistors 423 through 425 are turned off, so that the standby internal voltage generator 141 is deactivated.

The operation of the standby internal voltage generator 141 will now be described. When reference voltage VREF and DLL reference voltage VREFP are applied, NMOS transistors 421 and 423 through 425 are turned on, so that the voltage at a node N6 is reduced to the level of the ground GND. Then, PMOS transistor 413 is turned on, generating the standby internal supply voltage SIVC. When the standby internal supply voltage SWVC increases, NMOS transistor 422 is turned on and thus PMOS transistors 411 and 412 are also turned on. As a result, the voltage at node N6 is increased and PMOS transistor 413 is turned off, reducing the standby internal supply voltage SIVC. NMOS transistor 426 is turned on when the standby internal supply voltage SIVC is increased and prevents the standby internal supply voltage SIVC from further increase. When the standby internal supply voltage SIVC is reduced, NMOS transistor 421 is turned on more than NMOS transistor 422. Accordingly, the voltage of the node N6 is reduced and thus PMOS transistor 413 is again turned on. In this manner, the standby internal supply voltage SIVC is maintained at a constant level.

Figure 5:
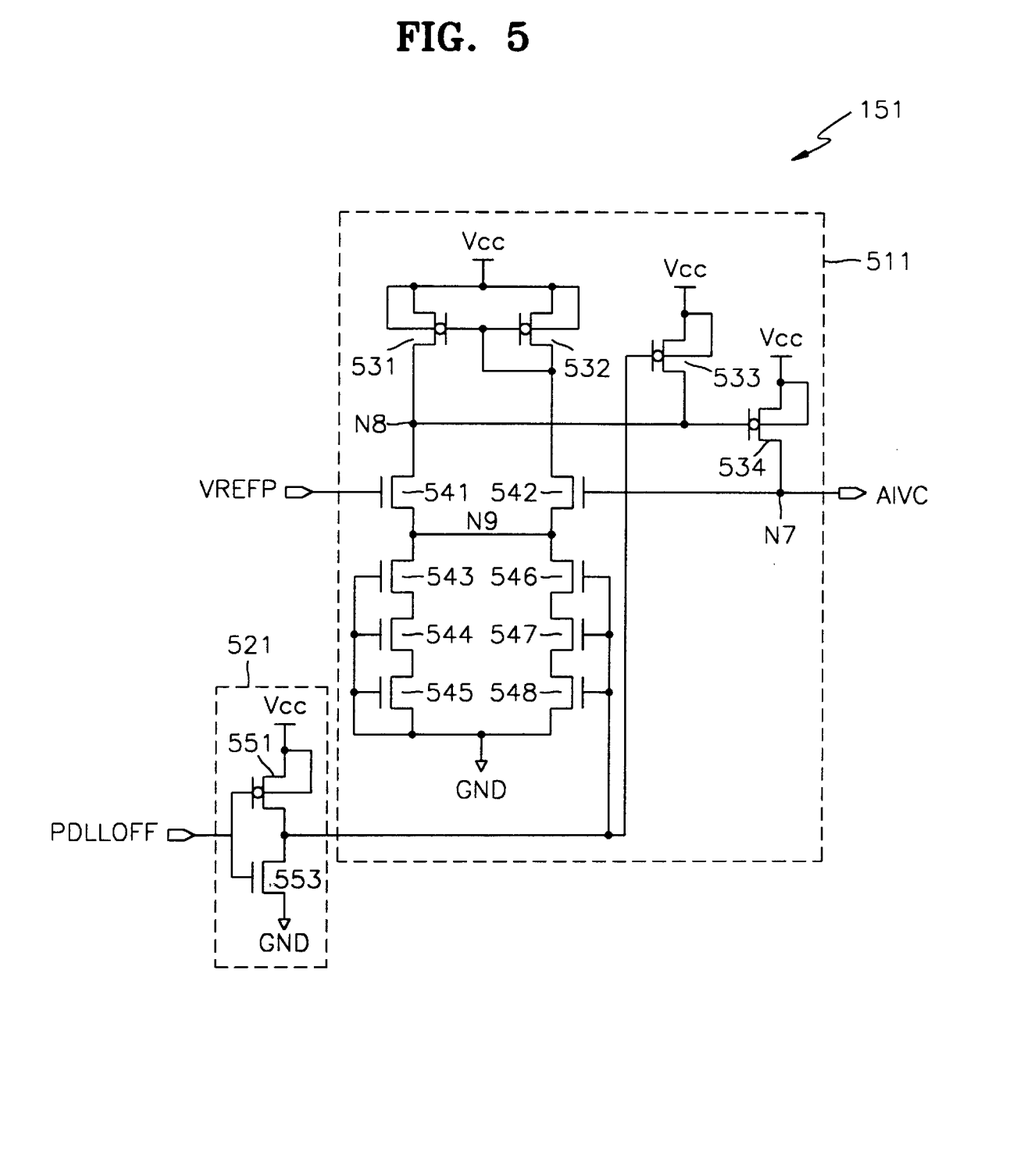
FIG. 5 is a circuit diagram illustrating the active internal voltage generator shown in FIG. 1.

The active internal voltage generator 151 of FIG. 1 receives a control signal PDLLOFF and a DLL reference voltage VREFP and generates an active internal supply voltage AIVC. The active internal voltage generator 151 is shown in more detail in FIG. 5. Referring to FIG. 5, the active internal voltage generator 151 comprises a differential amplifier and includes a differential amplification unit 511 and a control unit 521.

The differential amplification unit 511 comprises PMOS transistors 531 through 534 and NMOS transistors 541 through 548. The DLL reference voltage VREFP is applied to the gate of NMOS transistor 541, and the active internal supply voltage AIVC is generated at a node N7. The active internal supply voltage AIVC is applied to the gate of NMOS transistor 542. NMOS transistors 543 through 545 are connected in series between a node N9 and a ground GND, and NMOS transistors 546 through 548 also are connected in series between node N9 and ground GND. The gates of NMOS transistors 546 through 548 act as a current source for the active internal voltage generator 151 in response to the output of control unit 521. When the output of control unit 521 is logic high, NMOS transistors 546 through 548 are turned on and thus active internal voltage generator 151 is activated. When the output of control unit 521 is logic low, NMOS transistors 546 through 548 are turned off and thus the active internal voltage generator 151 is deactivated.

The control unit 521 comprises an inverter for inverting control signal PDLLOFF and includes PMOS and NMOS transistors 551 and 553 connected in series between a power supply voltage VCC and ground GND. The control signal PDLLOFF is applied to the gates of PMOS and NMOS transistors 551 and 553. Accordingly, when the control signal PDLLOFF is logic high, NMOS transistor 553 is turned on, so that the output of the control unit 521 is logic low. When the control signal PDLLOFF is logic low, PMOS transistor 551 is turned on, so that the output of control unit 521 is logic high. Thus, when control signal PDLLOFF is disabled to logic low, the differential amplification unit 511 is activated, and when control signal PDLLOFF is enabled to logic high, the differential amplification unit 511 is deactivated.

The output of control unit 521 is also applied to the gate of PMOS transistor 533. When the output of control unit 521 is logic high, PMOS transistor 533 is turned off. On the other hand, when the output of control unit 521 is logic low, PMOS transistor 533 is turned on, applying the power supply voltage VCC to the gate of PMOS transistor 534 to turn off PMOS transistor 534, thereby preventing generation of the active internal supply voltage AIVC. Thus, when control signal PDLLOFF is logic high, the active internal supply voltage AIVC is not generated.

The operation of the active internal voltage generator 151 will now be described. When the DLL reference voltage VREFP is applied to differential amplification unit 511 while control signal PDLLOFF is disabled, NMOS transistor 541 is turned on, so that the voltage at node N8 is reduced to the level of ground GND. As a result, PMOS transistor 534 is turned on, applying the power supply voltage VCC to node N7, thereby generating the active internal supply voltage AIVC. When the active internal supply voltage AIVC is increased, NMOS transistor 542 is turned on, and PMOS transistors 531 and 532 are turned on. As a result, the voltage at node N8 is increased, so that PMOS transistor 534 is turned off. Thus, the active internal supply voltage AIVC is reduced. When the active internal supply voltage AIVC is reduced, NMOS transistor 541 is turned on more than NMOS transistor 542, so that the voltage at node N8 is reduced. Thus, PMOS transistor 534 is again turned on, so that the active internal supply voltage. AIVC is again increased. In this way, the active internal supply voltage AIVC is maintained at a constant level.

The delay locked loop (DLL) 111 as shown FIG. 1, for reducing the skew between data and a clock, receives reference voltage VREF, DLL reference voltage VREFP, standby internal supply voltage SIVC, and active internal supply voltage AIVC.

Figure 6:
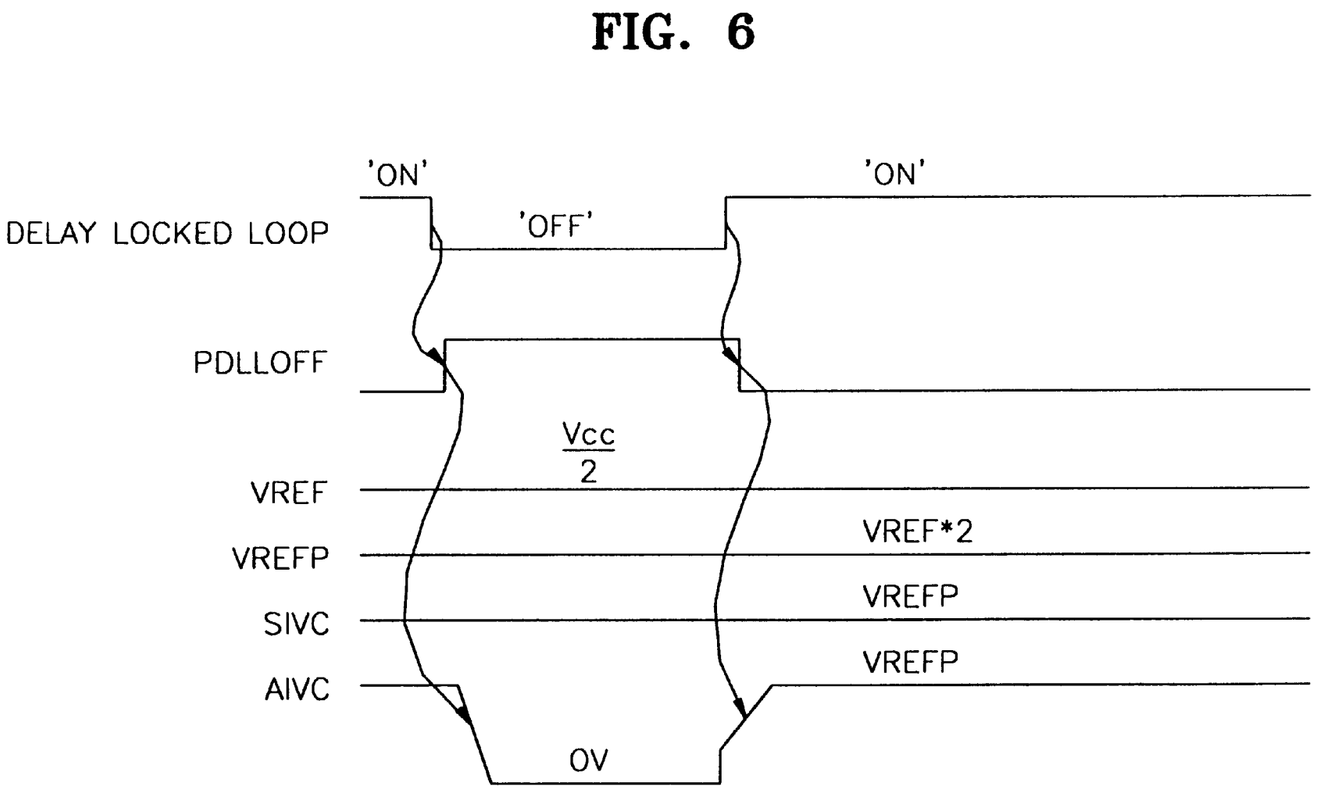
FIG. 6 is a timing diagram for the delay locked loop voltage supply unit of FIG. 1.

FIG. 6 is a timing diagram for the DLL control circuit shown in FIG. 1. Referring to FIG. 6, when the DLL 111 is not in use (OFF), the control signal PDLLOFF is enabled to logic high. When the control signal PDLLOFF is enabled, the DLL reference voltage VREFP is generated, preferably at twice the reference voltage VREF. If the control signals P4KB and HITE are logic high and logic low, respectively, the standby internal supply voltage SIVC is generated, preferably also at twice the reference voltage VREF. However, the active internal supply voltage AIVC is not generated.

If the DLL 111 is now activated (ON), the control signal PDLLOFF is disabled to logic low. When the control signal PDLLOFF is disabled, the DLL reference voltage VREFP and the standby internal supply voltage VREFP are generated as before, and the active internal supply voltage AIVC now is generated, preferably at the same voltage as the DLL reference voltage VREFP.

Thus, according to the first embodiment of the present invention as described above, if the DLL 111 is in use, the control signal PDLLOFF is enabled and the active internal voltage generator 151 is deactivated, thus reducing unnecessary power consumption.

Figure 7:
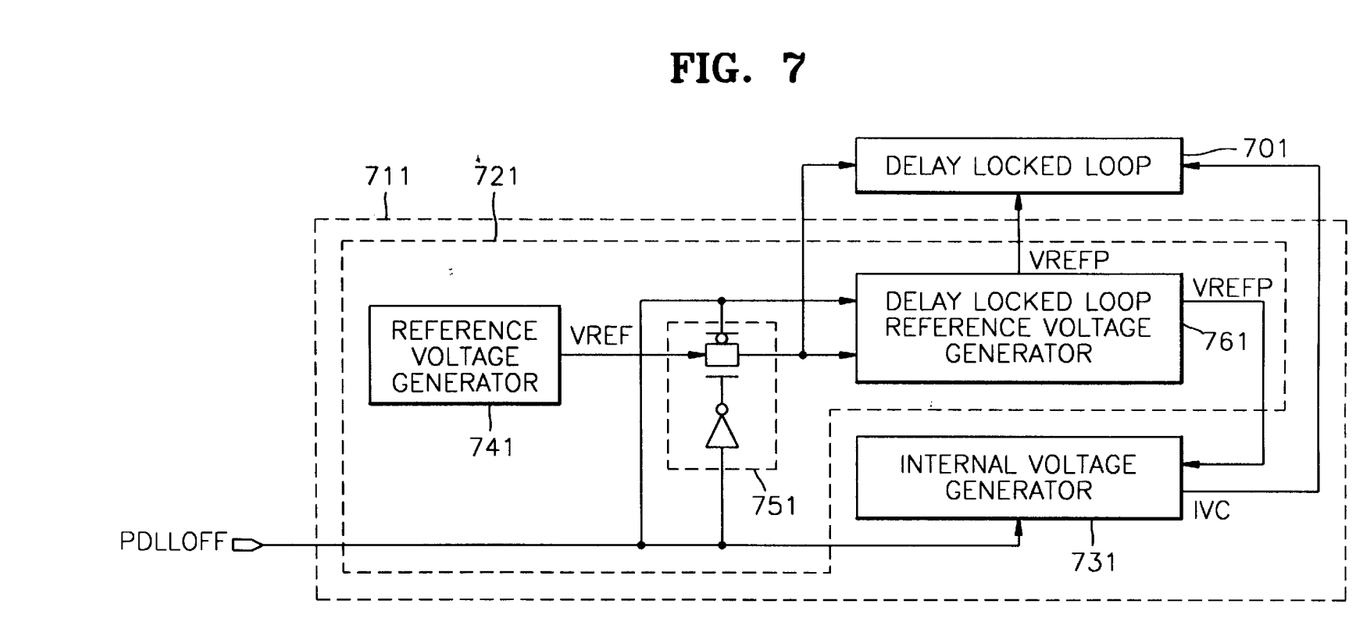
FIG. 7 is a block diagram illustrating a delay locked loop voltage supply unit in a semiconductor memory device according to a second embodiment of the present invention.

FIG. 7 is a block diagram of a DLL voltage supply circuit of a semiconductor memory device according to a second embodiment of the present invention. Referring to FIG. 7, the DLL voltage supply circuit includes a DLL 701 and a voltage supply unit 711. The DLL 701 reduces the skew between a clock and data. The voltage supply unit 711 supplies a required voltage when the DLL 701 operates and is deactivated when the DLL 701 is not operating.

The voltage supply unit 711 includes a reference voltage generation unit 721 and an internal voltage generator 731. The reference voltage generation unit 721 receives the control signal PDLLOFF, generates the DLL reference voltage VREFP and supplies it to DLL 701 when control signal PDLLOFF is disabled. The reference voltage generation unit 721 is deactivated when the control signal PDLLOFF is enabled. The reference voltage generation unit 721 comprises a reference voltage generator 741, a DLL reference voltage generator 761, and a switch 751.

The reference voltage generator 741 generates the reference voltage VREF. The reference voltage generator 741 has the same circuit configuration and operation as that in the circuit shown in FIG. 2, so a description thereof will be omitted to avoid duplication.

Figure 8:
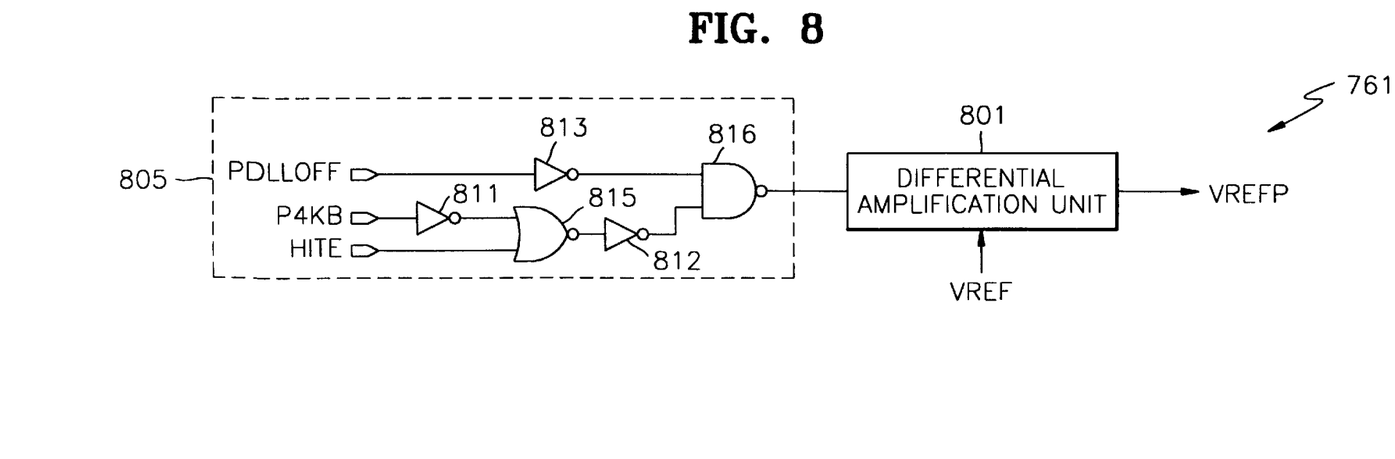
FIG. 8 is a circuit diagram illustrating a reference voltage generator for the delay locked loop shown in FIG. 7.

The DLL reference voltage generator 761 receives the control signal PDLLOFF and the reference voltage VREF, generates the DLL reference voltage VREFP when the control signal PDLLOFF is disabled, and is deactivated when the control signal PDLLOFF is enabled. The DLL reference voltage generator 761 is shown in more detail in FIG. 8. Referring to FIG. 8, the DLL reference voltage generator 761 includes a differential amplification unit 801 and a logic unit 805. The differential amplification unit 801 has the same circuit configuration and operation as the differential amplification unit 301 shown in FIG. 3, so description thereof will be omitted to avoid duplication.

The logic unit 805 receives the signals P4KB and HITE and the control signal PDLLOFF, and outputs a logic high signal when control signal PDLLOFF is logic high, or when the signal P4KB is logic high and the signal HITE is logic low. Logic unit 805 comprises inverters 811, 812, and 813, a NOR gate 815, and a NAND gate 816. Inverter 811 inverts the signal P4KB. NOR gate 815 receives the output of inverter 811 and signal HITE and performs a NOR operation on these signals. Inverter 812 inverts the output of NOR gate 815, and inverter 813 inverts the control signal PDLLOFF. NAND gate 816 receives the outputs of inverters 812 and 813, performs a NAND operation on these signals, and outputs the result as the output of the logic unit 805. Thus, when control signal PDLLOFF is logic low and signal P4KB is logic low or signal HITE is logic high, the output of logic unit 805 is logic low, so that differential amplification unit 801 is activated and the DLL reference voltage VREFP is generated. However, when control signal PDLLOFF is enabled to logic high, the output of logic unit 805 becomes logic high, so that differential amplification unit 801 is deactivated and the DLL reference voltage VREFP is not generated.

The switch 751 is connected between the reference voltage generator 741 and the DLL reference voltage generator 761. The switch 751 transmits the reference voltage VREF to the DLL reference voltage generator 761 and the DLL 701 in response to the control signal PDLLOFF. The switch 751 consists of a transmission gate having a control electrode to which the control signal PDLLOFF is applied, and an input electrode to which the reference voltage VREF is applied. The switch 751 is turned off when the control signal PDLLOFF is enabled to logic high, and does not transmit the reference voltage VREF to the DLL reference voltage generator 761 and the DLL 701. On the other hand, when the control signal PDLLOFF is disabled to logic low, the switch 751 is turned on, so that the reference voltage VREF is transmitted to the DLL reference voltage generator 761 and the DLL 701.

The internal voltage generator 731 receives the control signal PDLLOFF and the DLL reference voltage VREFP, and generates an internal supply voltage IVC and supplies it to the DLL 701 when the control signal PDLLOFF is disabled. The internal voltage is deactivated when the control signal PDLLOFF is enabled. The internal voltage generator 731 has the same circuit configuration and operation as the active internal voltage generator 151 shown in FIG. 5, so a description thereof will be omitted to avoid duplication.

Figure 9:
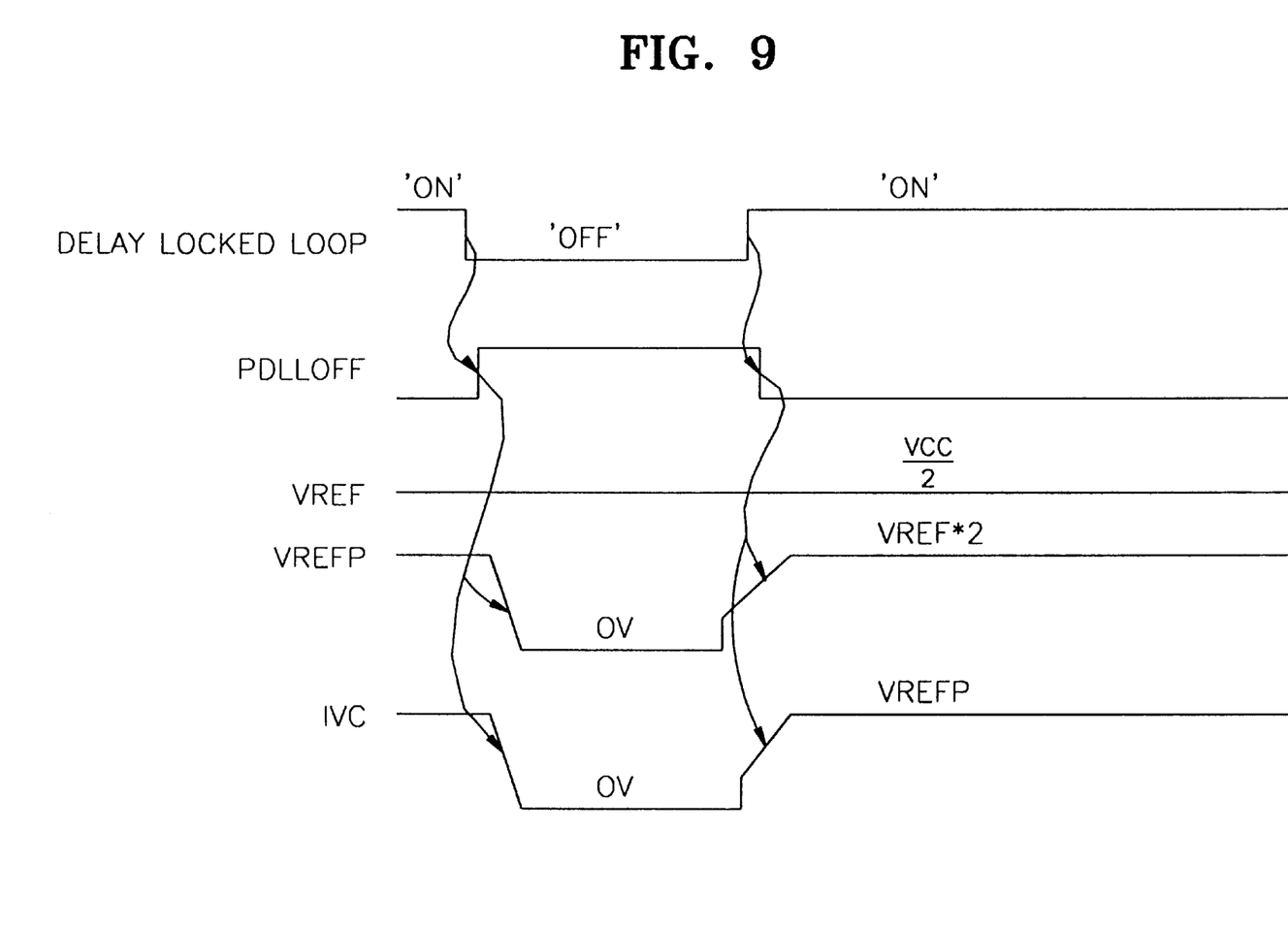
FIG. 9 is a timing diagram for the delay locked loop voltage supply unit of FIG. 7.

FIG. 9 is a timing diagram for the DLL control circuit shown in FIG. 7. Referring to FIG. 9, if the DLL 701 is not in use (OFF) the control signal PDLLOFF is enabled to logic high. The reference voltage VREF is generated (with a voltage level of half the power supply voltage VCC) and the DLL reference voltage VREFP and the internal supply voltage IVC are not generated (i.e. it has a voltage level of 0V). Thereafter, if the DLL 701 is activated, the control signal PDLLOFF is disabled to logic low. When the control signal PDLLOFF is disabled, the reference voltage VREF is generated as above, and the DLL reference voltage VREFP and the internal supply voltage IVC are now generated with a value being twice the reference voltage VREF.

According to the second embodiment as described above, if the DLL 701 is not used, the control signal PDLLOFF is enabled and the DLL reference voltage generator 761 and the internal voltage generator 731 are deactivated, so that unnecessary power consumption is reduced even more than for the circuit shown in FIG. 1. To further reduce power consumption, the first and second embodiments of the invention preferably utilize CMOS transistors.

According to the delay locked loop control circuit of the present invention as described above, if the DLL is not used, the circuits for generating the supply voltages and reference voltages for the DLL are deactivated, so that unnecessary power consumption is reduced. Thus, a delay locked loop control circuit has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A semiconductor memory device having a mode requiring a delay locked loop operation and a mode not requiring the delay locked loop operation comprising:

a reference voltage generator for generating a reference voltage;

a delay locked loop reference voltage generator for receiving a control signal and the reference voltage and for generating a delay locked loop reference voltage if the control signal is disabled, the delay locked loop reference voltage generator being deactivated if the control signal is enabled; and a switch connected between the reference voltage generator and the delay locked loop reference voltage generator for transmitting the reference voltage to the delay locked loop reference voltage generator in response to the control signal.

2. The semiconductor memory device of claim 1, wherein the switch is a transmission gate.

3. The semiconductor memory device of claim 1, wherein the delay locked loop reference voltage generator comprises:

a differential amplification unit for receiving the reference voltage and generating the delay locked loop reference voltage; and a logic unit for receiving the control signal and preventing generation of the delay locked loop reference voltage by deactivating the differential amplification unit when the control signal is enabled.

4. The semiconductor memory device of claim 1, further comprising:

an internal voltage generator for receiving the control signal and the delay locked loop reference voltage and generating an internal supply voltage if the control signal is disabled.

5. The semiconductor memory device of claim 4, wherein the internal voltage generator comprises:

a differential amplification unit for receiving the delay locked loop reference voltage and generating the internal supply voltage; and a control unit for receiving the control signal and preventing generation of the internal supply voltage by deactivating the differential amplification unit when the control signal is enabled.

6. A method for operating a delay locked loop comprising:

providing a control signal which is disabled when the delay locked loop is in use and enabled when the delay locked loop is not in use;

generating a delay locked loop reference voltage only when the control signal is disabled;

generating an internal supply voltage only when the control signal is disabled; and transmitting the delay locked loop reference voltage and the internal supply voltage to the delay locked loop only when the control signal is disabled.

7. The method of claim 6, further comprising the step of generating a second reference voltage, wherein the second reference voltage is used to generate the delay locked loop reference voltage.

* * * * *